United States Patent
Miyahara

(10) Patent No.: US 7,031,412 B2
(45) Date of Patent: Apr. 18, 2006

(54) DIGITAL SIGNAL PROCESSING APPARATUS

(75) Inventor: Yasumitsu Miyahara, Kawasaki (JP)

(73) Assignee: NEC Electronics Corporation, (JP)

( * ) Notice: Subject to any disclaimer, the term of this patent is extended or adjusted under 35 U.S.C. 154(b) by 790 days.

(21) Appl. No.: 10/077,164

(22) Filed: Feb. 15, 2002

(65) Prior Publication Data

US 2002/0114414 A1   Aug. 22, 2002

(30) Foreign Application Priority Data

Feb. 20, 2001   (JP)   ............................ 2001-043791

(51) Int. Cl.
*H03D 1/04*   (2006.01)
*H04B 1/10*   (2006.01)

(52) U.S. Cl. ...................... 375/346; 375/350
(58) Field of Classification Search ................ 375/316, 375/346, 348, 140, 147, 148, 317, 340, 345, 375/350, 364; 329/349, 353; 455/296
See application file for complete search history.

(56) References Cited

U.S. PATENT DOCUMENTS

| | | | | |
|---|---|---|---|---|
| 4,433,425 A | * | 2/1984 | de Jaeger | ................ 375/364 |
| 4,603,703 A | * | 8/1986 | McGill et al. | ............... 600/544 |
| 4,992,736 A | * | 2/1991 | Stormont et al. | ........... 324/309 |
| 5,548,619 A | * | 8/1996 | Horiike et al. | ............... 375/344 |
| 5,640,424 A | * | 6/1997 | Banavong et al. | ........... 375/316 |
| 5,974,098 A | * | 10/1999 | Tsuda | ......................... 375/340 |
| 6,041,250 A | * | 3/2000 | dePinto | ...................... 600/509 |
| 6,285,768 B1 | * | 9/2001 | Ikeda | ....................... 381/71.11 |

* cited by examiner

*Primary Examiner*—Tesfaldet Bocure
*Assistant Examiner*—Naheed Ejaz
(74) *Attorney, Agent, or Firm*—Hayes Soloway P.C.

(57) ABSTRACT

A digital signal processing apparatus has an A/D converter, a digital filter, and an anti-aliasing circuit. The digital filter attenuates a frequency component within a preventing area by performing half-band processing to sampling data of a digital output which is outputted by the A/D converter. The anti-aliasing circuit measures a period of a sign signal which is outputted by the digital filter and, when the period of the sign signal is smaller than a threshold, the anti-aliasing circuit subjects the output of the digital filter to a shift operation in an LSB direction by the number of bits and outputs the processed signal. Thus, the sign signal outputted by the digital filter, which is subjected to the half-band processing, is used to realize a simple circuit for suppressing or removing aliasing noise caused by the half-band processing, with low costs.

11 Claims, 9 Drawing Sheets

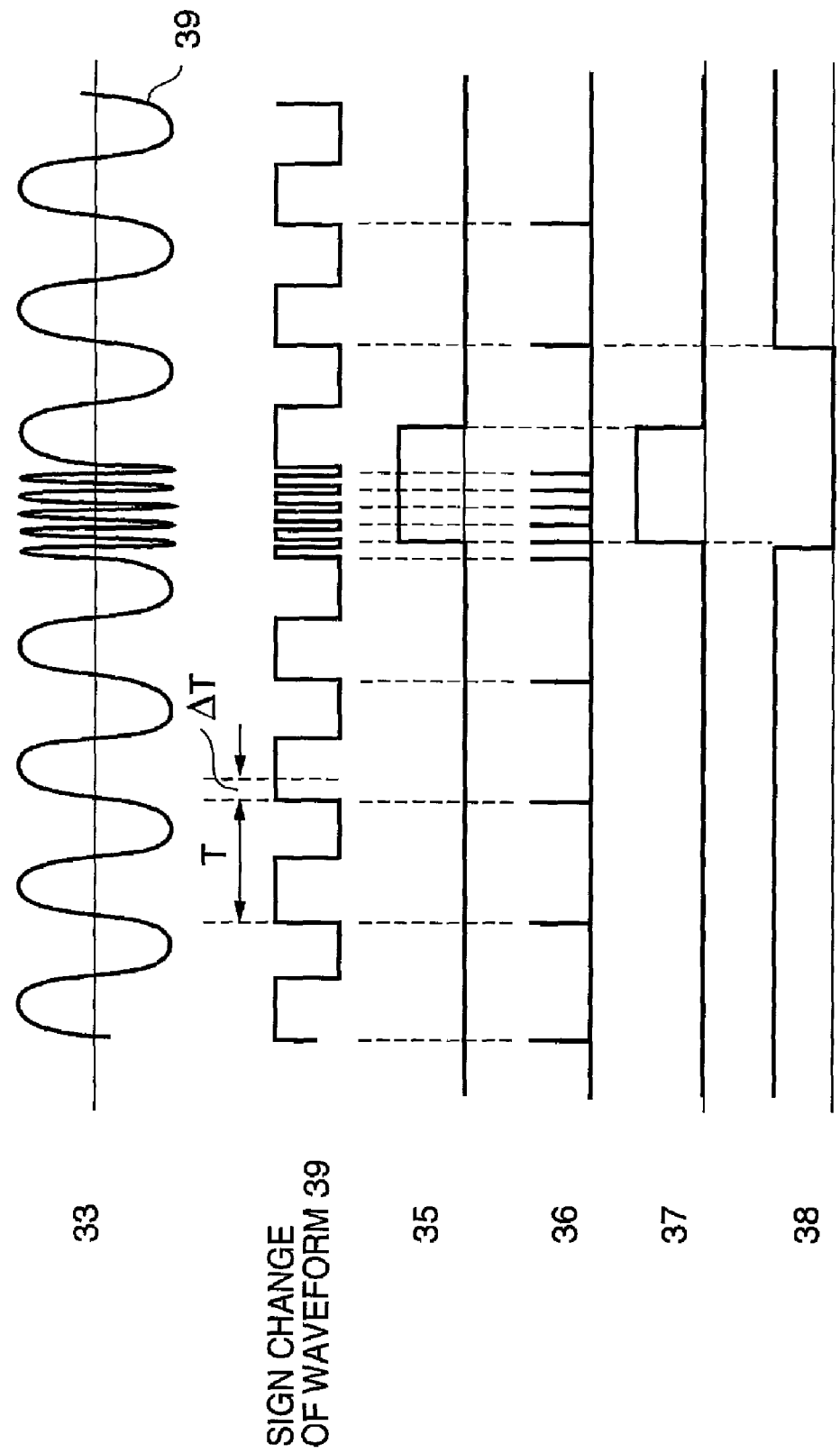

DIGITAL SIGNAL PROCESSING APPARATUS

BACKGROUND OF THE INVENTION

1. Field of the Invention

The present invention relates to a digital signal processing apparatus and, more particularly, to a digital signal processing apparatus for suppressing aliasing noise which is caused in association with half-band processing of a digital filter.

2. Description of the Background Art

In accordance with the advancement of digital technologies, various digital signal processing technologies are proposed in wide fields. In the above-mentioned digital signal processing, an analog input signal is converted into a digital signal by an analog/digital (hereinafter, referred to as an A/D) converter and then is subjected to various signal processing by latter-stage circuits. A digital filter serving as a general digital signal processing circuit performs calculation for a plurality of sampling data which is continuously inputted, attenuates a frequency component other than a normal band from among frequency components included in sampling outputs, and extracts only desired frequency component data. In general, the digital filter uses a method for increasing the amount of sampling data so as to improve an signal to noise (S/N) ratio. However, increasing the amount of sampling data causes an increase in circuit scale and in the amount of calculation times thereby prolonging calculation time.

Generally, half-band processing is well-known to solve the problem. In half-band processing, the ability to reduce the number of elements is increased as the amount of sampling data is larger, and calculation processing is facilitated by using the principle in that the S/N ratio of an output value is not changed upon setting a coefficient, which is multiplied by even-th sampling data, to be zero when the number of sampling data serving as a first processing target is odd. Since the coefficient is zero, the amount of calculation times is half. As a consequence, the number of multipliers, adders, and complement control circuits and the bit length of each register can be reduced.

However, since processing for the even-th sampling data is not performed in the half-band processing of the above-mentioned digital filter, it is equivalent that a sampling rate is reduced to ½. Then an aliasing-noise pass band when reducing the sampling rate is caused.

FIG. 1 is a diagram showing pass band characteristics of an output signal from the digital filter, in which the aliasing-noise is caused by the half-band processing, according to background art. An aliasing band 1, occurring because of the half-band processing, occurs at almost a half frequency of a sampling frequency of the digital filter, as a pass band different from a normal band 2 serving as an original pass band. Therefore, the analog input signal includes a frequency component having the above band and, when the frequency component has an influence on signal processing at the later stage of the digital filter, the half-band processing cannot be used. Even when purposely using half-band processing, a digital low-pass filter for anti-aliasing is necessary at the later stage of the digital filter. However, the digital low-pass filter needs calculation processing for a digital filter output and, therefore, the circuit scale and the number of calculation times are increased and the calculation time is long. An advantage for using the half-band processing to the digital filter is lost.

SUMMARY OF THE INVENTION

The present invention is devised in consideration of the above circumstances and it is an object of the present invention to provide a digital signal processing apparatus capable of suppressing or reducing aliasing noise which is caused in the half-band processing, with a simple circuit and reduced costs.

To accomplish the above object, according to a first aspect of the present invention, there is provided a digital signal processing apparatus, comprising: A digital signal processing apparatus comprising: an A/D converter for converting an analog input signal into a digital signal; a digital filter for performing half-band processing to a sampling output of a digital signal outputted by the A/D converter and for attenuating a frequency component other than a predetermined normal band from a frequency component included in the sampling output; and an anti-aliasing circuit for suppressing or removing noise having an aliasing band, which is caused by the half-band processing in the digital filter, by using a sign signal outputted from the digital filter. Accordingly, a simple circuit structure can suppress the aliasing noise with low costs.

Advantageously, the anti-aliasing circuit may determine whether the output from the digital filter, which is subjected to the half-band processing, is a pass signal having the normal band or a pass signal having the aliasing signal, based on a changing period of the sign signal outputted from the digital filter, and may suppress or remove only the pass signal having the aliasing band. With the above anti-aliasing circuit, since only the aliasing noise can be attenuated, a low-pass filter which has conventionally been needed is not arranged at the latter stage of the digital filter.

Advantageously, the anti-aliasing circuit may comprise: a period measuring circuit for measuring a changing period of the sign signal outputted by the digital filter; a threshold holding circuit for holding a period of an intermediate frequency between the normal band and the aliasing band; a comparator for comparing and determining whether or not the period measured by the period measuring circuit is larger than the threshold which is set to the threshold holding circuit and for outputting a shift control signal when it is determined that the period measured by the period measuring circuit is not larger than the threshold; and a shift register for shifting a signal which is inputted from the digital filter and is stored, based on the shift control signal, and for suppressing an amplitude of the aliasing noise. Accordingly, the attenuation of the aliasing noise can be controlled with high accuracy.

Advantageously, the anti-aliasing circuit may further comprise a delay circuit for delaying the output from the digital filter by a delay time which is taken by the measurement by the period measuring circuit and the comparison calculation by the comparator. Accordingly, the shift operation of the shift register, to which the delay data at the same time based on the output of the comparator, can be embodied with high accuracy.

Advantageously, the anti-aliasing circuit may comprise: a period measuring circuit for measuring a changing period of the sign signal which is outputted by the digital filter; a threshold holding circuit for holding a period of an intermediate frequency between the normal band and the aliasing band; a comparator for comparing and determining whether or not the period measured by the period measuring circuit is larger than the threshold set to the threshold holding circuit and for outputting a clear signal when it is determined that the period is not larger than the threshold; and a delay circuit for delaying the output from the digital filter by a delay time which is taken by the measurement of the period measuring circuit and the comparison calculation of the comparator and for erasing a signal during delay processing when the clear signal is inputted. Accordingly, the output of the unnecessary aliasing noise component can be prevented with this simple structure.

Advantageously, the anti-aliasing circuit may comprise: a period measuring circuit for measuring a changing period of the sign signal which is outputted by the digital filter; a threshold holding circuit for holding a period of an intermediate frequency between the normal band and the aliasing band; a comparator for comparing and determining whether or not the period measured by the period measuring circuit is larger than the threshold set to the threshold holding circuit and for outputting a clear signal when it is determined that the period is not larger than the threshold; and a delay circuit for delaying the output from the digital filter by a delay time which is taken by the measurement of the period measuring circuit and the comparison calculation of the comparator and for erasing a signal during delay processing when the clear signal is inputted. Accordingly, the output of the unnecessary aliasing noise component can be prevented with the simple structure.

According to a second aspect of the present invention, a digital signal processing apparatus comprises: an A/D converter for converting an analog input signal into a digital signal; a digital filter for performing half-band processing to a sampling output of a digital signal outputted by the A/D converter and for attenuating a frequency component other than a predetermined normal band from a frequency component included in the sampling output; an edge-detection circuit for detecting an edge of a sign signal which is outputted by the digital filter and for generating a set pulse; a period measuring circuit for measuring a changing period of the sign signal which is outputted by the digital filter; a threshold holding circuit for holding a period of an intermediate frequency between a normal band and an aliasing band; a comparator for comparing and determining whether or not the period measured by the period measuring circuit is larger than the threshold held by the threshold holding circuit and for outputting a reset pulse when it is determined that the period is not larger than the threshold; and a detection register for inputting the set pulse so as to be in a set state and outputting a first level and for inputting the reset pulse so as to be in the reset state and outputting a second level. Accordingly, erroneous detection upon passage of the aliasing noise can be prevented.

The above and other objects and features of the present invention will become apparent from the following detailed description and the appended claims with reference to the accompanying drawings.

BRIEF DESCRIPTION OF THE DRAWINGS

FIG. 9 is a timing chart of signals of block units in FIG. 8.

DESCRIPTION OF THE PREFERRED EMBODIMENTS

Hereinafter, a preferred embodiment of the present invention will be described in detail with reference to the drawings. Then, the embodiment of the present invention is shown as follows and, however, the present invention is not limited to the following.

Figure 2:
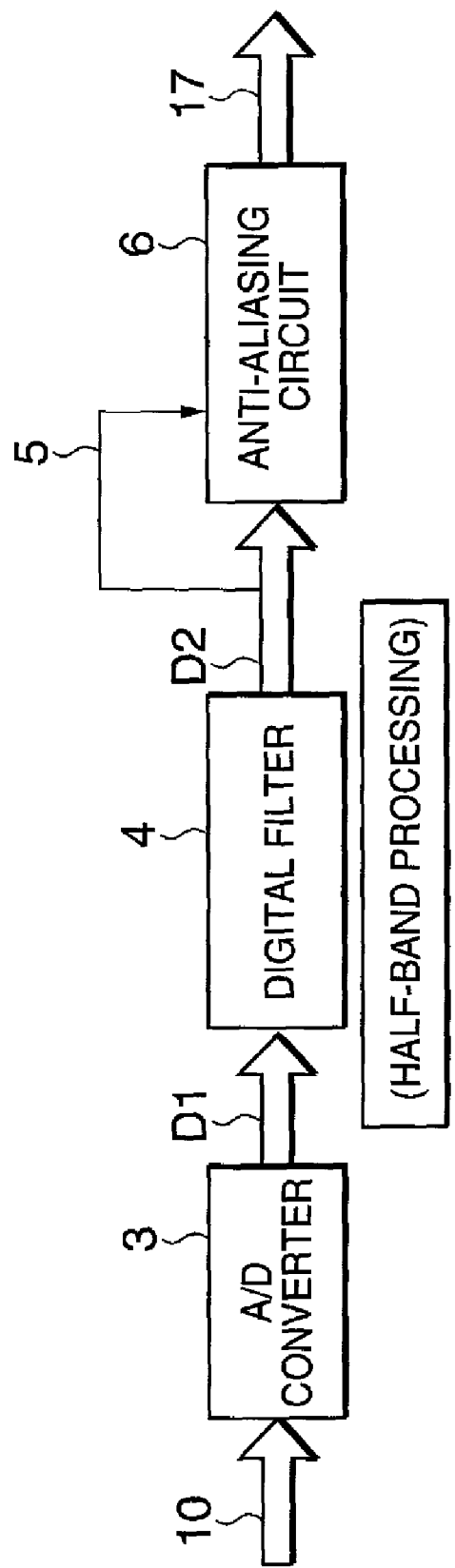
FIG. 2 is a block diagram showing a digital signal processing apparatus according to a first embodiment of the present invention.

FIG. 2 is a block diagram showing a digital signal processing apparatus according to a second embodiment of the present invention. Referring to FIG. 2, the digital signal processing apparatus comprises: an A/D converter 3 for converting an analog input signal 10 into a digital signal; a digital filter 4; and an anti-aliasing circuit 6 provided at the later stage of the digital filter 4, for suppressing aliasing noise by using a sign signal 5 outputted from the digital filter 4. The anti-aliasing circuit 6 determines whether the signal from the digital filter 4 is a signal having a normal band or the aliasing noise, by using a changing period of the sign signal 5, and attenuates only an aliasing noise component of the output from the digital filter 4. Consequently, although the half-band processing has not been used for the digital filter under the limitation of the number of mounted elements, it can be used for the digital filter. The digital filter purposely using the half-band processing does not need the low-pass filter which is arranged at the later stage of the digital filter. For example, when both the sampling data and the coefficients are 10 bits, several thousand elements are necessary for each multiplier. On the other hand, the anti-aliasing circuit 6 comprises approximately one thousand elements. Therefore, several thousand to several tens of thousands of elements can be reduced without using the low-pass filter.

Figure 3:
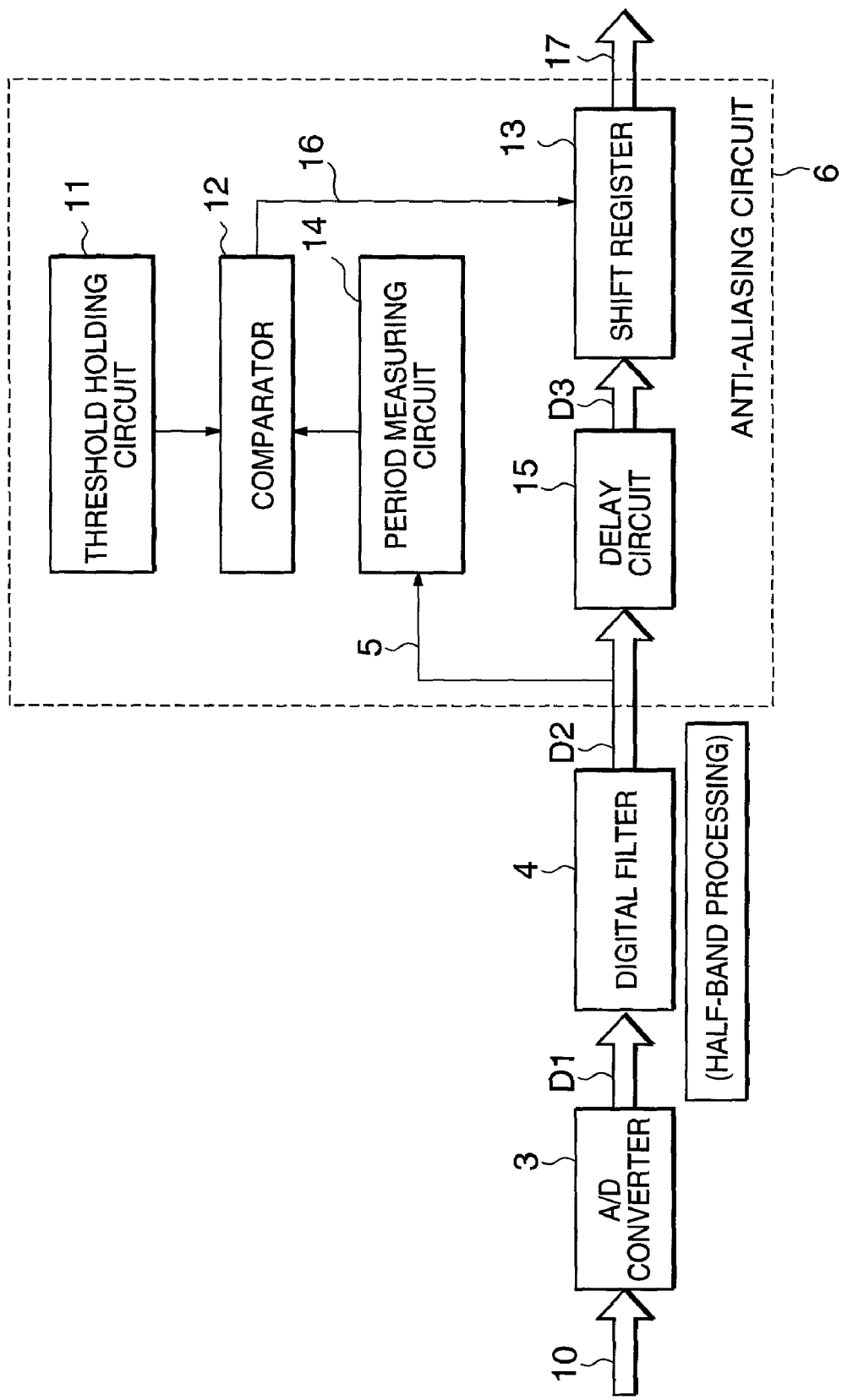
FIG. 3 is a block diagram specifically showing one example of an anti-aliasing circuit shown in FIG. 2 according to the first embodiment of the present invention.

FIG. 3 is a block diagram specifically showing one example of the anti-aliasing circuit in the digital signal processing apparatus. The digital signal processing apparatus comprises the A/D converter 3, the digital filter 4, and the anti-aliasing circuit 6. An analog input signal 10 is converted into a digital data signal D1 by the A/D converter 3. A frequency component within a preventing area, included in the digital data signal D1, is attenuated by the digital filter 4 which is subjected to the half-band processing. However, aliasing noise, caused by half-band processing is mixed in an output signal D2 from the digital filter 4. The output signal D2 of the digital filter 4 is inputted to the anti-aliasing circuit 6.

The anti-aliasing circuit 6 comprises: a period measuring circuit 14; a threshold holding circuit 11; a comparator 12, a shift register 13, and a delay circuit 15. The period measuring circuit 14 measures a changing period of a sign signal 5 which is outputted by the digital filter 4. The threshold holding circuit 11 holds a threshold for a sign changing period. The comparator 12 determines whether the period measured by the period measuring circuit 14 is larger than the threshold held in the threshold holding circuit 11. If it is determined that the period is not larger than the threshold, the comparator 12 outputs a shift control signal 16. When the shift control signal 16 is at an active level, the shift register 13 shifts a signal D3 inputted from the digital filter 4 and stored, thereby suppressing amplitude of the aliasing noise. The delay circuit 15 delays the output from the digital filter 4 by a delay time which is taken by the measurement of the period measuring circuit 14 and the comparison calculation of the comparator 12.

Figure 1:
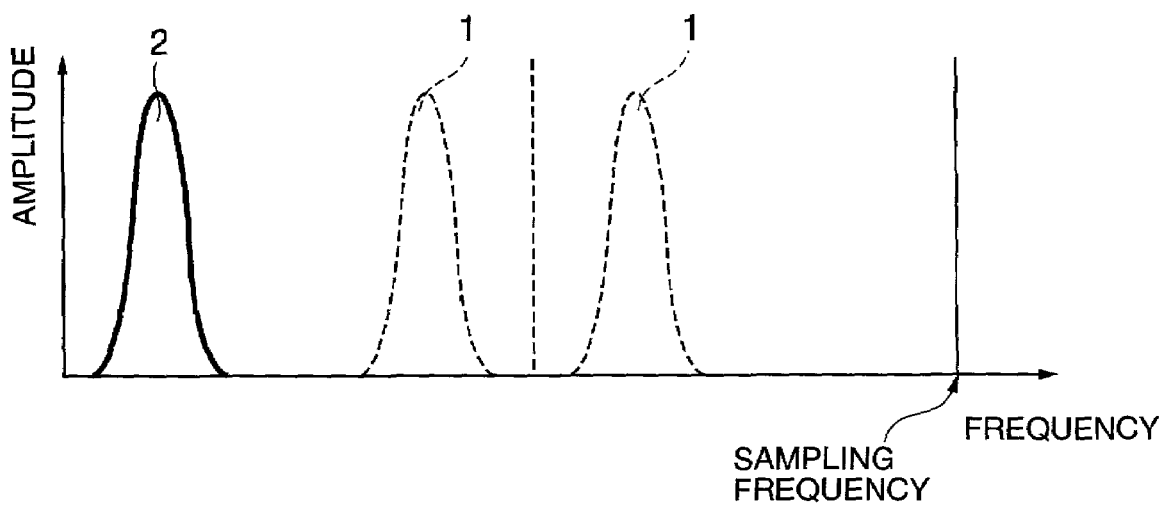
FIG. 1 is a diagram showing pass band characteristics of an output signal of a digital filter, in which aliasing noise is caused by a half-band processing of a digital filter, according to a background art of the present invention.

As shown in FIG. 1, a normal-band signal of the digital filter 4 becomes low in an output frequency band of the digital filter 4, and the aliasing noise becomes approximately half of the sampling frequency of the digital filter 4. A signal having an intermediate frequency band between the normal-band signal and the aliasing noise is attenuated by the original function of the digital filter 4. Therefore, the sign changing period of the signal which passes through the normal band, is clearly different from the sign changing period of the noise signal which passes through the aliasing band.

The comparator 12 can clearly determine whether the signal from the digital filter 4 is the normal-band signal or the aliasing noise, by setting the sign changing period of the intermediate frequency between the normal band and the aliasing band, to the threshold holding circuit 11. If the period measured by the period measuring circuit 14 is longer than the sign changing period set to the threshold holding circuit 11, the comparator 12 sets the shift control signal 16 to be "0" as the normal-band signal. If it is shorter than, the comparator 12 sets the shift control signal 16 to be "1" as the active level and as the aliasing noise. The shift control signal 16 from the comparator 12 is used as the shift control signal 16 of the shift register 13. If the shift control signal 16 is "0", the shift operation is not performed. If it is "1", the shift operation is performed by one bit in an LSB (least significant bit) direction. Consequently, the amplitude of only the aliasing noise can be attenuated to be half. In the above processing, it is determined whether or not the shift operation is performed at the sign changing point and no glitch is therefore caused without discontinuous change of a phase of an output signal 17.

Figure 4:
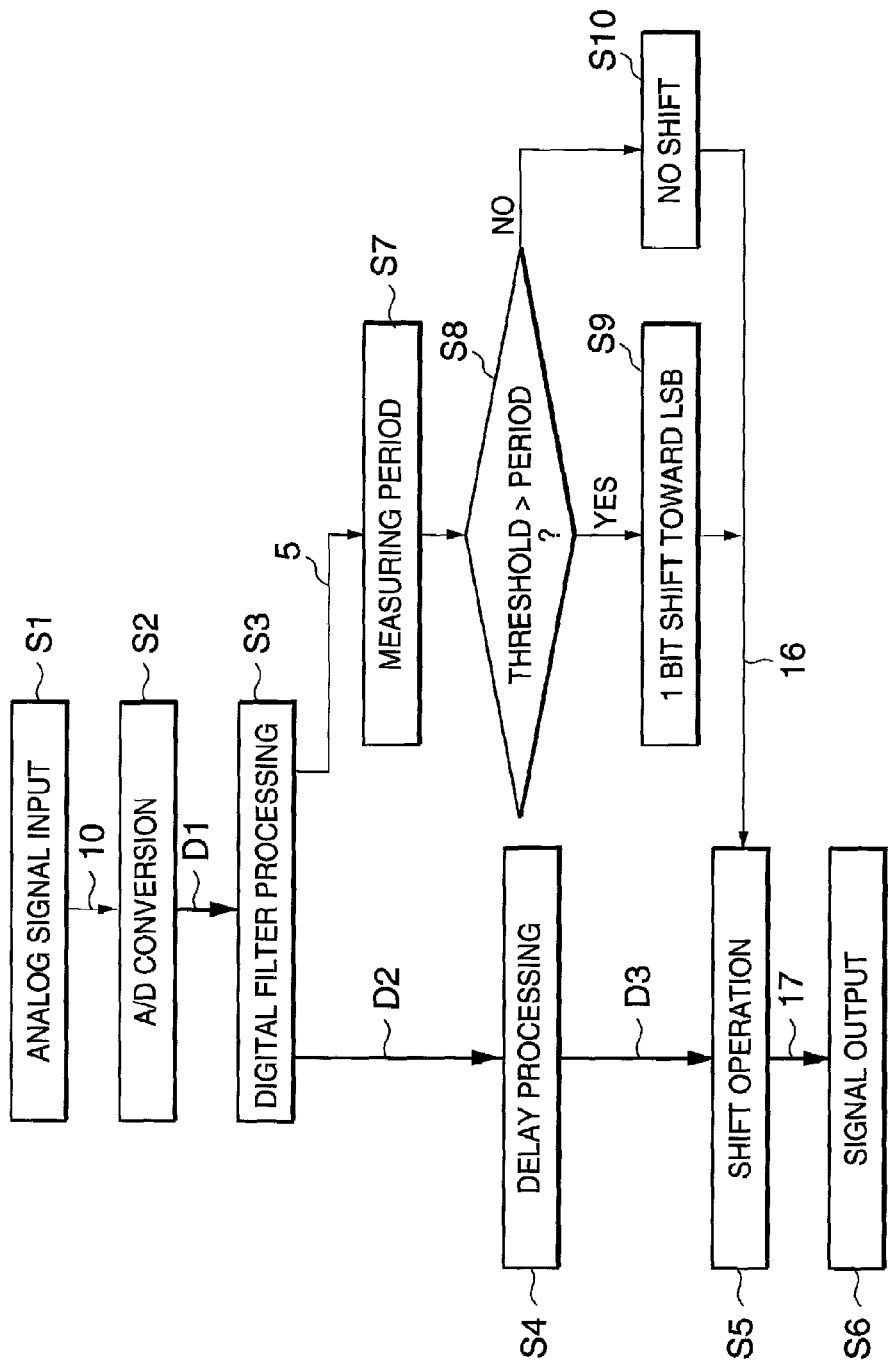
FIG. 4 is a flowchart showing a processing routine of digital signal processing of the present invention.

A next operation will be described with reference to a flowchart shown in FIG. 4 and a timing chart shown in FIG. 5. First, if the analog input signal 10 is inputted (step S1), the A/D converter 3 converts the analog input signal 10 into the digital data signal D1 step S2). The sampling data of the digital data signal D1 is inputted to the digital filter 4 and is subjected to the half-band processing (step S3). The output subjected to the half-band processing is delayed by the delay circuit 15 (step S4). Further, the delay signal is under the shift control by the shift register 13 (step S5), and is sequentially outputted (step S6).

Figure 5:
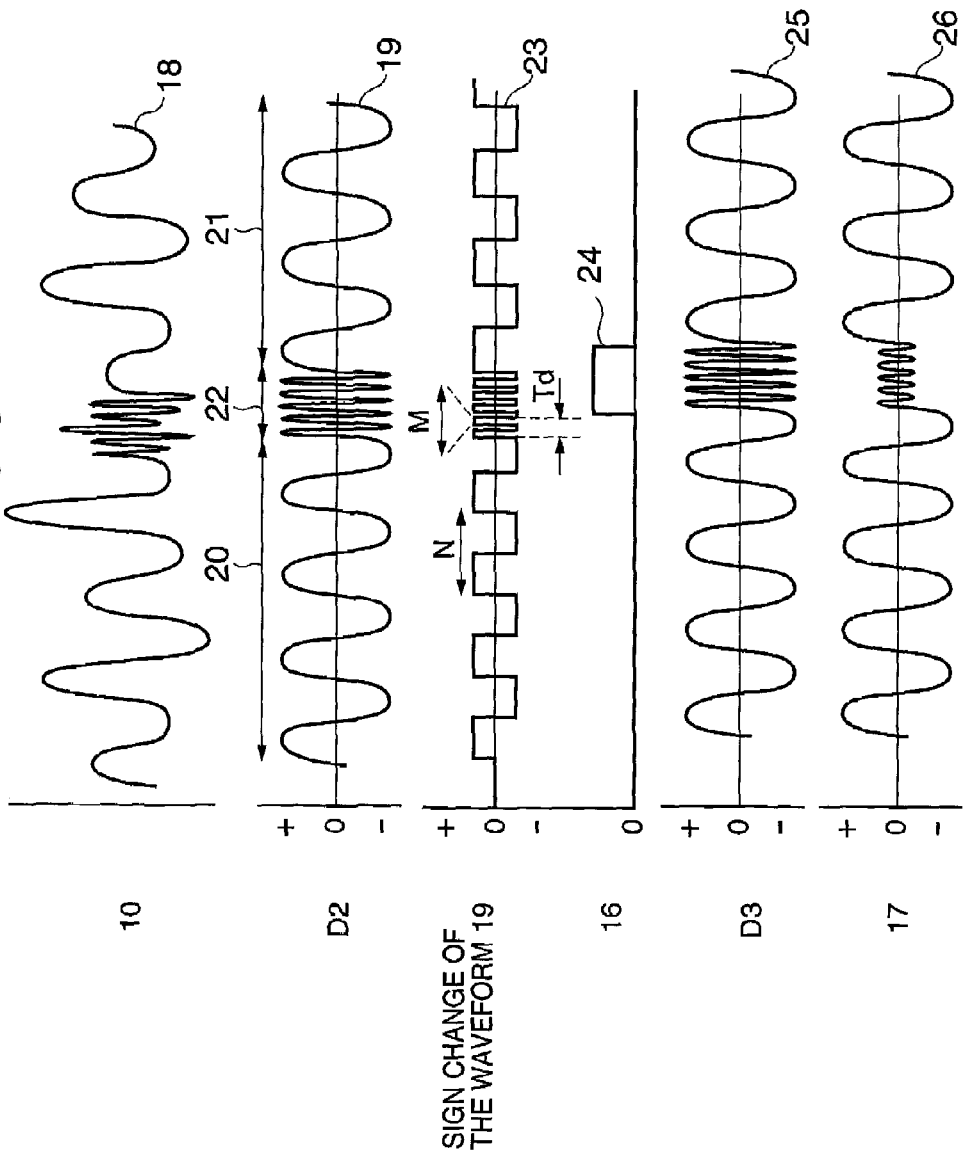
FIG. 5 is a timing chart of signals of block units in FIG. 3.

Referring to FIG. 5, a waveform 18 represents an analog input signal 10 and a waveform 19 represents an amplitude image of the output signal D2 of the digital filter 4, which is subjected to the half-band processing. Intervals 20 and 21 in the waveform 19 represent the normal-band signal. As shown by an interval 22, the aliasing noise to be inherently attenuated passes through the digital filter 4 because it is subjected to the half-band processing. A waveform 23 represents the sign change of the waveform 19. As shown by the waveform 23, a period difference between a sign changing period N of the normal-band signal and a sign changing period M of the aliasing noise signal, clearly exists through the digital filtering processing.

Referring back to FIG. 4, the sign changing period of the sign signal 5 is measured based on the output signal D2 after the half-band processing (step S7). The measured sign changing period of the sign signal 5 is compared with a threshold (step S8). The threshold is set in advance to establish a relationship of (sign changing period M<threshold A<sign changing period N). If the comparison result, when the sign changing period M is smaller than the threshold A, is "1", the shift control signal 16, serving as the comparison results becomes "1" only during the occurrence of the aliasing noise, as shown by waveform 24. Therefore, the shift control signal 16 can be used as a detection signal of the aliasing band pass signal. Incidentally, the waveform 24 is delayed from the waveform 19 by a delay time Td. Thus, the output signal D2 of the digital filter 4 shown by the waveform 19 is subjected to delay processing by the delay time Td by the delay circuit 15. Then, output signal D2 is stored in the shift register 13 as the signal D3 shown by an amplitude image waveform 25. The signal shown by the waveform 24 is obtained as the comparison result and is inputted to the shift register 13 as the shift control signal 16.

If the sign changing period M is smaller than the threshold A, that is, if the waveform 24 is "1", the shift register 13 assumes that aliasing noise is input and then shifts the output from the digital filter 4, which is stored in the shift register 13, at the same time, in the LSB direction by one bit (step S9), and suppresses the amplitude to a half. On the other hand, if the sign changing period is larger than the threshold A, i.e., if the waveform 24 is "0", the shift register 13 assumes that the normal-band signal is input, and a signal indicating that the shift operation is not performed is output (step S10). The signal is output without the shift processing of the shift register 13 (steps S5 and S6). In this case, a waveform 26 represents an amplitude image of an output signal 17 of the shift register 13. As described above, the amplitude of only the aliasing noise can be suppressed without changing the amplitude of the normal-band signal.

Figure 6:
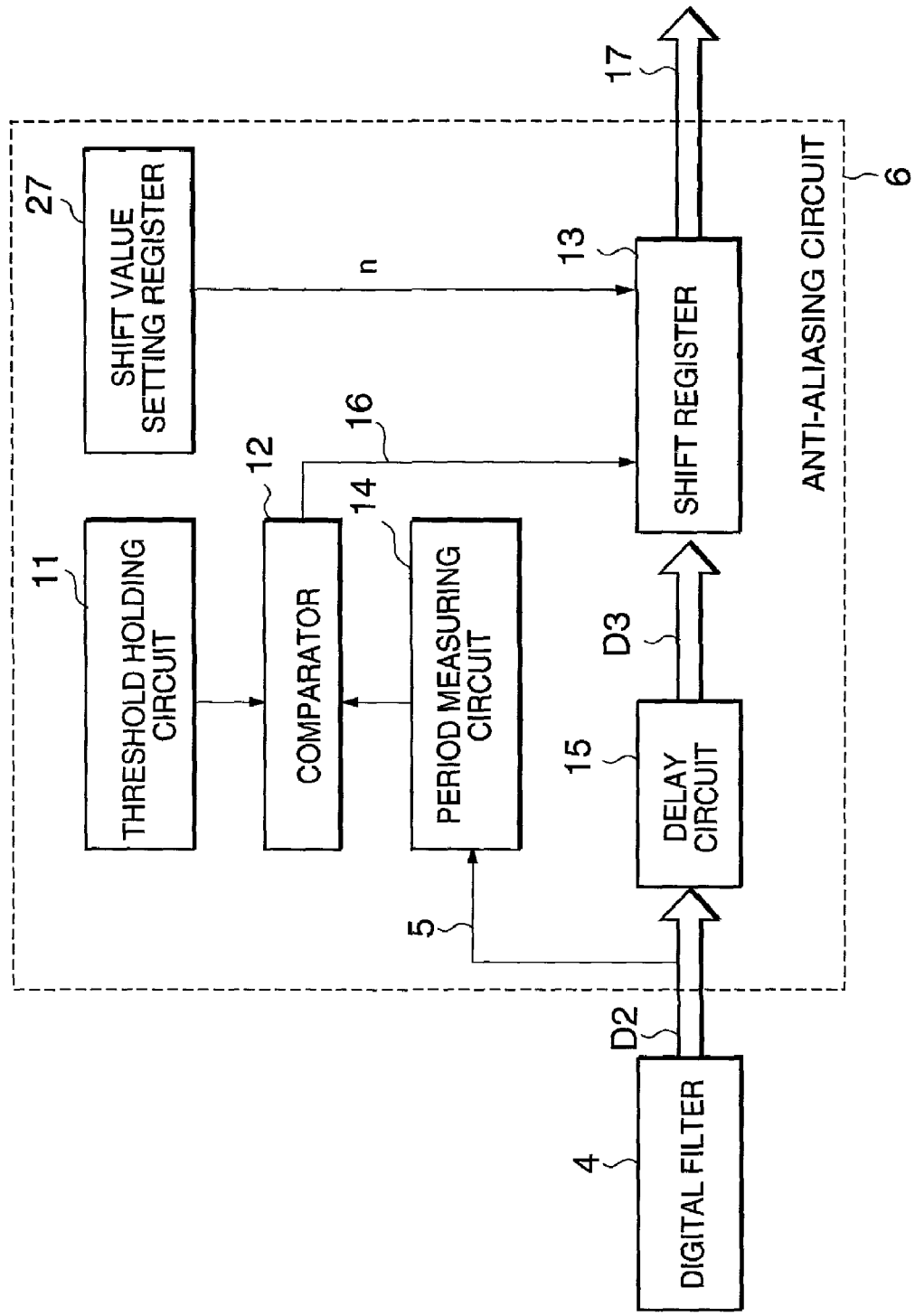
FIG. 6 is a block diagram specifically showing another example of the anti-aliasing circuit according to the first embodiment of the present invention.

FIG. 6 is a diagram showing another example of the anti-aliasing circuit according to the first embodiment of the present invention. In the anti-aliasing circuit shown in FIG. 6, a shift value setting register 27 for controlling the number of bits of the shift register 13 is added. Consequently, the amount of attenuation of the output data from the digital filter 4 can arbitrarily be adjusted when the aliasing noise is detected. Namely, when a number n of bits of the shift register 13 is set to the shift value setting register 27, an amplitude of the output data is 1/(2n).

Figure 7:
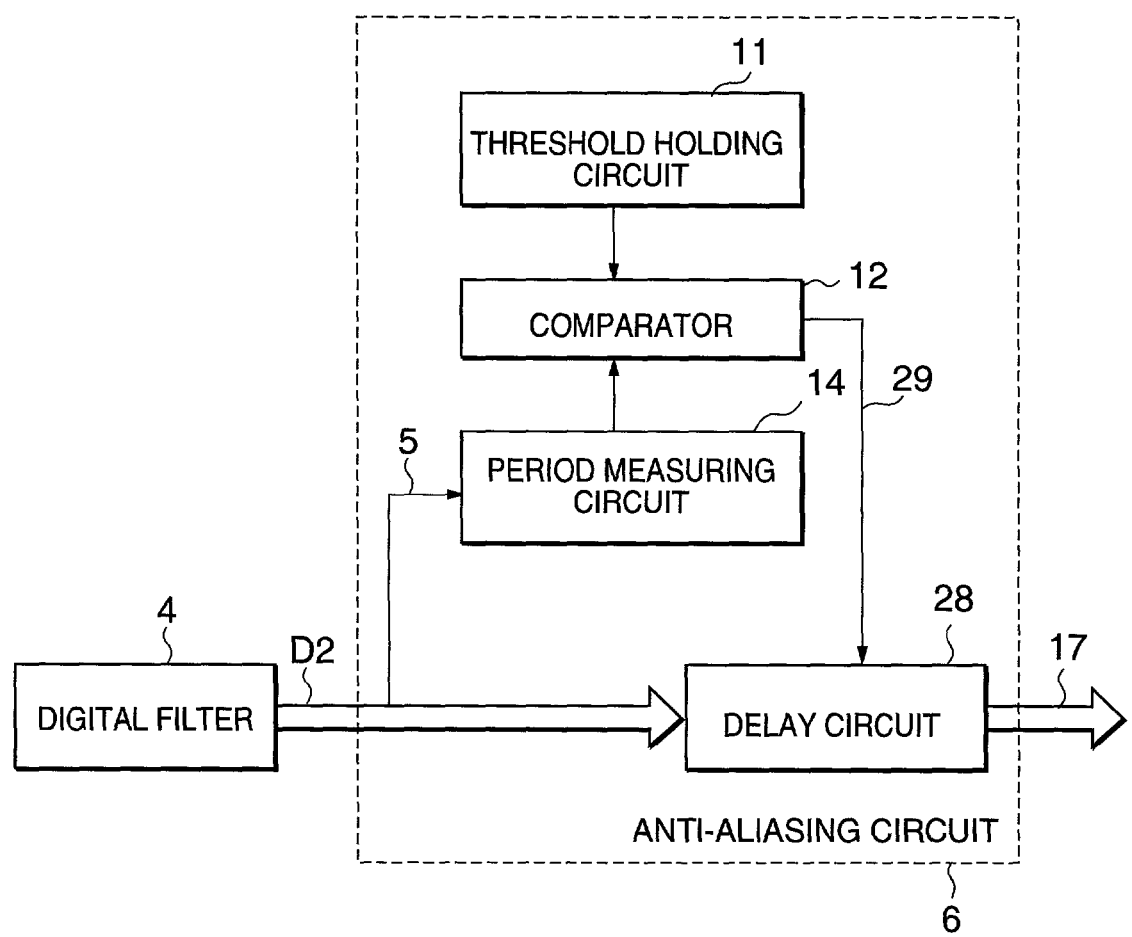
FIG. 7 is a block diagram specifically showing further another example of the anti-aliasing circuit according to the first embodiment of the present invention.

FIG. 7 is a diagram showing further another example of the anti-aliasing circuit according to the first embodiment of the present invention. Herein, the shift register 13 shown in FIG. 2 is deleted and the output of the comparator 12 is set to be a clear signal 29 of the delay circuit 28. The delay circuit 28 delays the output from the digital filter 4 by a delay time which is taken by the measurement of the period measuring circuit 14 and by the comparison calculation of the comparator 12, and erases a signal during the delay processing when the clear signal 29 is input. With the above-mentioned structure, the unnecessary aliasing noise component can completely be removed.

Figure 8:
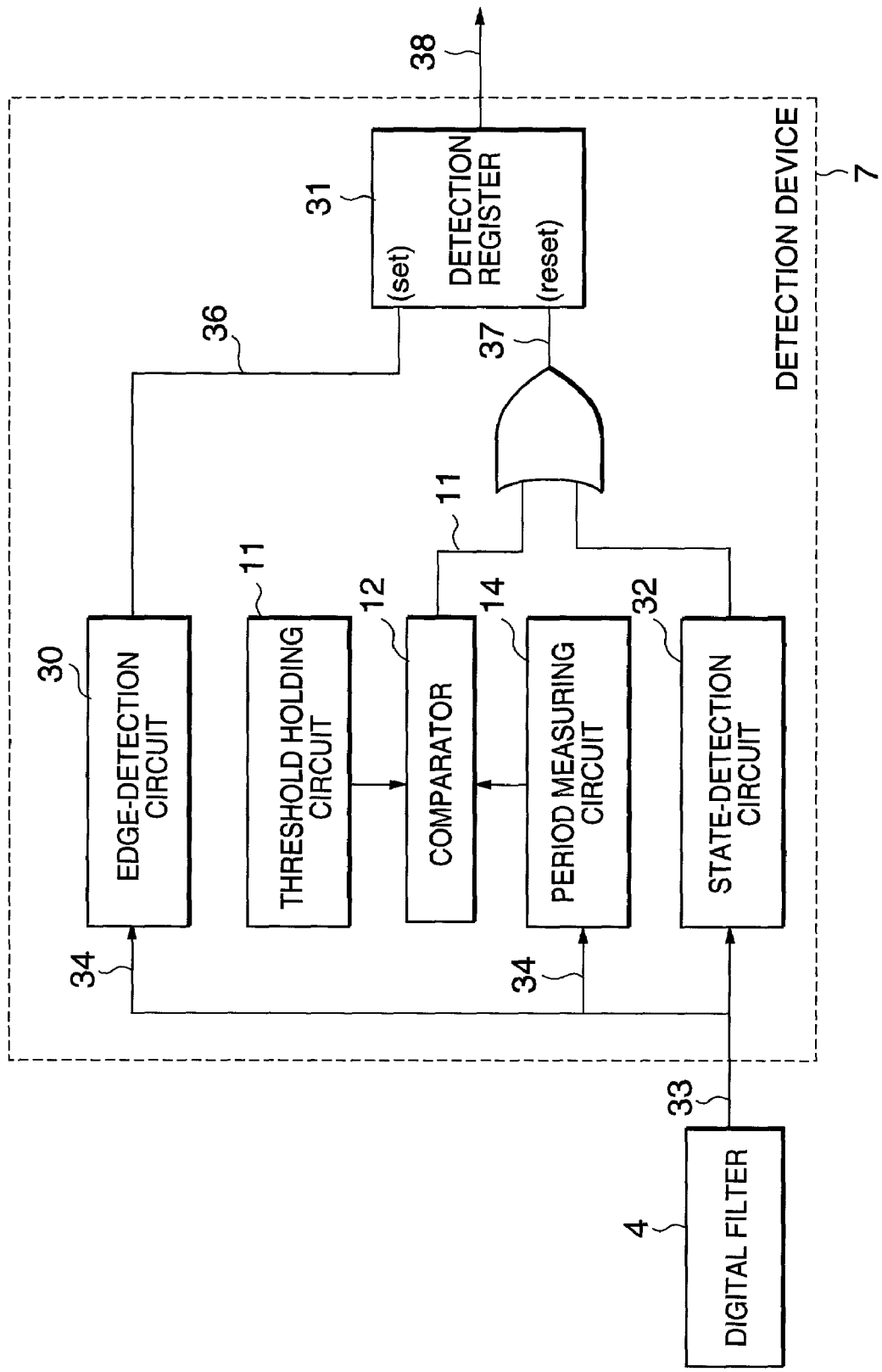
FIG. 8 is a block diagram showing a detection device using a sign output of the digital filter according to a second embodiment of the present invention.

FIG. 8 is a block diagram of a detection device using a sign signal of the output from the digital filter according to a second embodiment of the present invention, and FIG. 9 is a timing chart of signals from block units in FIG. 8. In a detection device 7 shown in FIG. 8, the period measuring circuit 14 measures a sign changing period of a sign signal 34 from the digital filter 4, and the comparator 12 compares the measured sign changing period with the threshold which is set to the threshold holding circuit 11. If the sign changing period measured by the period measuring circuit 14 is smaller than the threshold, it is determined that the aliasing noise is detected and a reset pulse 35 is generated. A waveform 39 shown in FIG. 9 represents an amplitude image of an output 33 from the digital filter 4. The sign signal 34 from digital filter 4 is input to an edge-detection circuit 30, a rise edge is detected, and a set pulse 36 is generated to a detection register 31. By adding the reset pulse 35 to a reset terminal of the detection register 31, an output signal 38 of the detection register 31 is set to be "0" during detection of the aliasing noise and erroneous detection due to the aliasing noise is prevented. Incidentally, if the set pulse 36 is not input to the detection register 31 during a period (T+ΔT) which is longer than a sign changing period T of the output 33 from the digital filter 4, a state-detection circuit 32 outputs the reset pulse 35 to the detection register 31.

As mentioned above, in the present invention, since the aliasing noise caused by the half-band processing is suppressed or removed by using the sign signal of the output from the digital filter for the half-band processing, the half-band processing can be used for the digital filter though it has not been used for the digital filter due to the effect of the aliasing noise. The anti-aliasing method can be embodied with low costs because the aliasing noise caused by the half-band processing is suppressed or removed by using the shift register and the simple control circuit instead of the low-pass filter. In particular, as the digital filter needs a higher S/N ratio, advantageously, costs can be reduced because input sampling data and bit length of the coefficient to which the input sampling data is multiplied, are prolonged.

What is claimed is:

1. A digital signal processing apparatus comprising:
an A/D converter for converting an analog input signal into a digital signal;
a digital filter performing half-band processing to a sample output of said digital signal, and attenuating a frequency component other than a predetermined normal frequency band included in the sample output; and
an anti-aliasing circuit for suppressing or removing aliasing noise having an aliasing frequency band caused by the half-band processing in said digital filter, said noise is suppressed or removed using a sign signal output from said digital filter a period measuring circuit for generating measurement of period changes in the sign signal output by said digital filter; a threshold holding circuit for setting a threshold equal to a period of an intermediate frequency between the normal frequency band and the aliasing frequency band; a comparator for comparing and determining whether or not the period measured by said period measuring circuit is larger than the threshold, and for outputting a shift control signal when it is determined that the measurement of said period measuring circuit is not larger than the threshold; and a shift register for shifting a signal which is input from said digital filter and stored, based on said shift control signal, and for suppressing an amplitude of the aliasing noise.

2. The apparatus according to claim 1, wherein said anti-aliasing circuit determines whether the output from said digital filter is a pass signal with the having the normal frequency band or a pass signal having the aliasing frequency band, using a changing period of the sign signal output from said digital filter, said anti-aliasing circuit suppresses or removes only the pass signal having the aliasing frequency band.

3. The apparatus according to claim 1, wherein said anti-aliasing circuit further comprises a shift value setting register, to which the number of shift bits is set when the signal is subjected to shift processing by said shift register.

4. The apparatus according to claim 1, wherein said anti-aliasing circuit further comprises a delay circuit for delaying the output from said digital filter by a delay time which corresponds to a time for said comparator to output said shift control signal.

5. The apparatus according to claim 1, wherein said anti-aliasing circuit comprises:
a delay circuit for delaying the output from said digital filter by a delay time which corresponds to a time for said comparator to output said shift control signal and for erasing a signal during delay processing when said clear signal is inputted.

6. A digital signal processing apparatus comprising:
an A/D converter for converting an analog input signal into a digital signal;
a digital filter performing half-band processing to a sample output of said digital signal, and attenuating a frequency component other than a predetermined normal frequency band included in the sample output;
an edge-detection circuit for detecting an edge of a sign signal output by said digital filter and for generating a set pulse;
a period measuring circuit for generating a measurement of period changes in the sign signal which is output by said digital filter;
a threshold holding circuit for setting a threshold equal to a period of an intermediate frequency between a normal frequency band and an aliasing frequency band;
a comparator for comparing and determining whether or not the period measured by said period measuring circuit is larger than the threshold and for outputting a reset pulse when the period is not larger than the threshold; and
a detection register outputting a first signal when said set pulse is received as input thereby placing said detection register in a set state and outputting a second signal when said reset pulse is input thereby placing said detector register in said reset state.

7. A digital signal processing apparatus comprising:
a digital filter performing half-band processing on a digital signal to output a processed signal and a sign signal; and
an anti-aliasing circuit coupled to said digital filter to suppress or remove an aliasing noise from said processed signal by use of said sign signal a period measuring circuit for measuring a changing period of the sign signal outputted by said digital filter; a threshold holding circuit for holding a period of an intermediate frequency between the normal band and the aliasing band; a comparator for comparing and determining whether or not the period measured by said period measuring circuit is larger than the threshold which is set to said threshold holding circuit and for outputting a shift control signal when it is determined that the period measured by said period measuring circuit is not larger than the threshold; and a shift register for shifting a signal which is inputted from said digital filter and is stored, based on said shift control signal, and for suppressing an amplitude of the aliasing noise.

8. The apparatus according to claim 7, wherein said anti-aliasing circuit determines whether the output from said digital filter, which is subjected to said half-band processing, is a pass signal having a normal band or a pass signal having the aliasing signal, based on a changing period of the sign signal outputted from said digital filter, and suppresses or removes only the pass signal having the aliasing band.

9. The apparatus according to claim 1, wherein said anti-aliasing circuit further comprises a shift value setting register, to which the number of shift bits is set when the signal, which is inputted from said digital filter and is stored, is subjected to shift processing by said shift register.

10. The apparatus according to claim 1, wherein said anti-aliasing circuit further comprises a delay circuit for delaying the output from said digital filter by a delay time which is taken by the measurement by said period measuring circuit and the comparison calculation by said comparator.

11. The apparatus according to claim 7, wherein said anti-aliasing circuit comprises:

a delay circuit for delaying the output from said digital filter by a delay time which is taken by the measurement of said period measuring circuit and the comparison calculation of said comparator and for erasing a signal during delay processing when said clear signal is inputted.

* * * * *